United States Patent [19]
Pascucci et al.

[11] Patent Number: 5,566,114
[45] Date of Patent: Oct. 15, 1996

[54] REDUNDANCY CIRCUITRY FOR A SEMICONDUCTOR MEMORY DEVICE

[75] Inventors: Luigi Pascucci; Carla M. Golla, both of Sesto San Giovanni, Italy

[73] Assignee: SGS-Thomson Microelectronics S.r.l., Agrate Brianza, Italy

[21] Appl. No.: 349,783

[22] Filed: Dec. 6, 1994

[30] Foreign Application Priority Data

Dec. 7, 1993 [EP] European Pat. Off. .............. 93830491

[51] Int. Cl.$^6$ .............................. G11C 7/00; G11C 29/00
[52] U.S. Cl. ........................................ 365/200; 365/230.06
[58] Field of Search ..................................... 365/200, 195, 365/230.06; 371/10.1, 10.2, 10.3; 326/10; 327/526

[56] References Cited

U.S. PATENT DOCUMENTS

| | | | |
|---|---|---|---|
| 4,376,300 | 3/1983 | Tsang | 365/200 |
| 4,745,582 | 5/1988 | Fukushi | 365/200 |
| 4,862,416 | 8/1989 | Takeuchi | 365/200 |
| 4,947,378 | 8/1990 | Jinbo | 365/200 |
| 5,381,370 | 1/1995 | Lacey | 365/200 |

FOREIGN PATENT DOCUMENTS

| | | | |
|---|---|---|---|
| 0029322 | 5/1981 | European Pat. Off. | G06F 11/20 |
| 0333207 | 9/1989 | European Pat. Off. | G06F 11/20 |

*Primary Examiner*—David C. Nelms
*Assistant Examiner*—Son Mai
*Attorney, Agent, or Firm*—Seed and Berry LLP; David V. Carlson; Bryan A. Santarelli

[57] ABSTRACT

A redundancy circuitry for a semiconductor memory device comprising a matrix of memory elements and a plurality of programmable non-volatile memory registers. The non-volatile memory registers being programmable to store addresses of defective memory elements that must be replaced by redundancy memory elements. The redundancy circuitry comprises a combinatorial circuit supplied by address signals and supplying the non-volatile registers with an inhibition signal for inhibiting the selection of redundancy memory elements when a memory element of the matrix is addressed whose address coincides with the address stored in a non-programmed memory register.

13 Claims, 2 Drawing Sheets

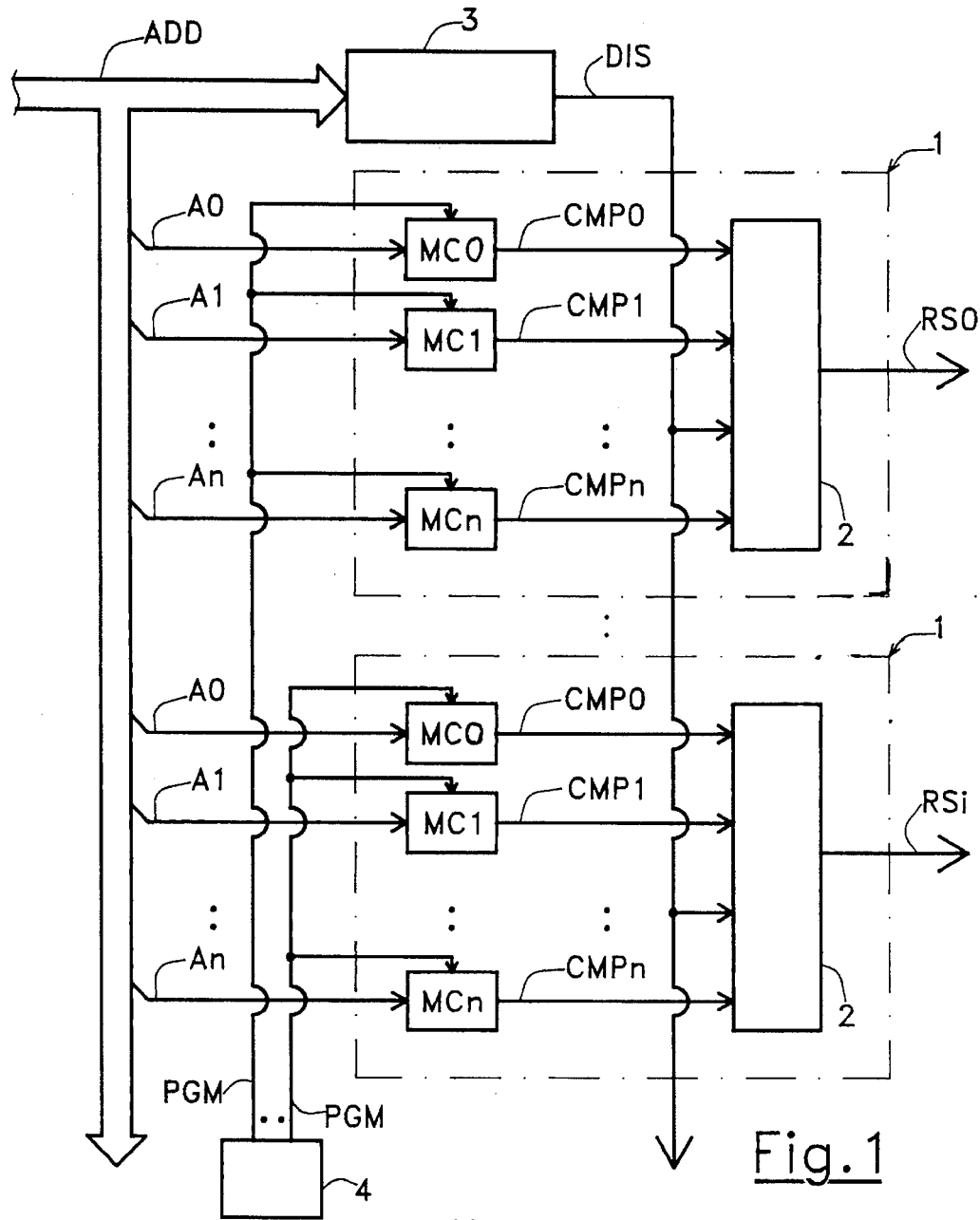
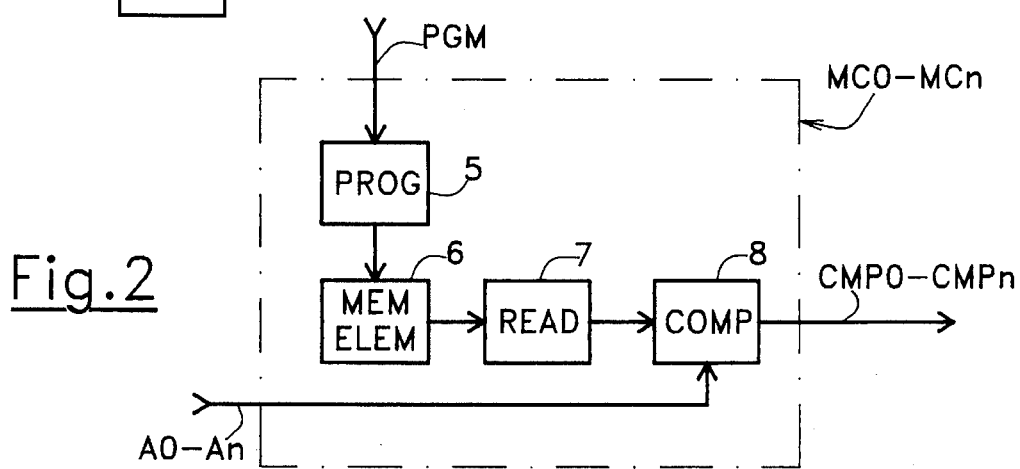

REDUNDANCY CIRCUITRY FOR A SEMICONDUCTOR MEMORY DEVICE

CROSS-REFERENCE TO RELATED APPLICATIONS

The present invention is related to European Application No. 93830493.8. This European application is a basis for priority for a co-pending United States application filed in the U.S. Patent Office under attorney docket no. 853063.407 and bearing a title of "Integrated Circuitry for Checking the Utilization Rate of Redundancy Memory Elements in a Semiconductor Memory Device." This application also claims priority from European Application No. 93830491.2, filed on Dec. 7, 1993. Both of the above European applications are incorporated by reference herein.

TECHNICAL FIELD

The present invention relates to a redundancy circuitry for a semiconductor memory device.

BACKGROUND OF THE INVENTION

In the manufacture of semiconductor memories defects are frequently encountered that afflict a limited number of memory elements in the memory matrix. The reason for the high probability of defects of this type resides in that in a semiconductor memory device the greatest part of the chip area is occupied by the memory matrix; moreover, it is in the memory matrix, and not in the peripheral circuitry, that the manufacturing process characteristics are usually pushed to limits.

In order to avoid that the presence of a limited number of defective memory elements, from among many millions, forces the rejection of the entire chip, and therefore decreases the manufacturing process yield, a number of "redundancy memory elements" are added to the chip. These additional memory elements are used as a replacement of those elements that, during testing of the memory device, prove defective. Selection circuits, with which the integrated component must necessarily be provided, and which allow the above-mentioned functional replacement of a defective memory element with a redundancy memory element, are indicated as a whole with the name of "redundancy circuitry." The set of redundancy memory elements and circuitry is defined for short as "redundancy".

The redundancy circuitry comprises programmable non-volatile memory registers suitable to store those address configurations corresponding to the defective memory elements; such registers are programmed once and for all during the memory device testing, and must retain the information stored therein even in absence of the power supply.

In practical implementations of redundancy, both rows ("word lines") and columns ("bit lines") of redundancy memory elements are provided in the memory matrix. Each redundancy word line or bit line is associated with a respective non-volatile memory register, wherein the address of a defective word line or bit line is stored so that, whenever the defective word line or bit line is addressed, the corresponding redundancy word line or bit line is selected. This implies that each non-volatile memory registers must be made up of a number of programmable memory cells at least equal to the number of bits in the row address bus, if the register is associated with a redundancy word line, or in the column address bus, if the register is instead associated with a redundancy bit line. Each memory cell of a memory register is therefore dedicated to store the logical state of a particular address bit, in the row or column address configurations, corresponding to a defective word line or bit line, and comprises at least one programmable memory element, a circuit for programming the memory element, a circuit for reading the information stored in the memory element and a circuit for comparing said information with the current logical state of the address bit associated with the memory cell.

If each non-volatile memory register is made up of a number of programmable memory cells exactly equal to the number of bits in the row address bus or in the column address bus, an ambiguous selection can take place. This ambiguity occurs because unprogrammed non-volatile memory registers, associated with unused redundancy word lines or bit lines, store that particular address configuration corresponding to the unprogrammed condition of the memory cells, and this particular address configuration belongs to the set of all the possible address configurations for the memory device. For example, when a non-defective word line or bit line is addressed whose address coincides with the logical configuration of the memory cells in an unprogrammed memory register, the redundancy word line or bit line associated with said unprogrammed register will be selected instead of the non-defective word line or bit line. The situation is even worse in memory devices where two or more redundancy word lines or bit lines are not used. In this case, the unprogrammed condition is the same for all the memory cells of the non-volatile memory registers, addressing the non-defective word line or bit line whose address coincides with the configuration of the unprogrammed memory cells would cause said two or more redundancy word lines or bit lines to be selected simultaneously.

To prevent such unacceptable ambiguous or even simultaneous selection, each non-volatile memory register is provided with an additional programmable memory cell (called "guard memory cell" or "control memory cell") which allows the selection of the associated redundancy word line or bit line only when the guard cell is programmed.

This causes a significant increase in the overall chip area.

SUMMARY OF THE INVENTION

In view of the state of art described, the object of the present invention is to realize a redundancy circuitry wherein it is not necessary to provide each non-volatile memory register with a respective guard memory cell.

According to the present invention, such object is attained by means of a redundancy circuitry for a semiconductor memory device comprising a matrix of memory elements, which comprises a plurality of programmable non-volatile memory registers, which are programmable to store addresses of defective memory elements which must be replaced by redundancy memory elements, characterized by comprising combinatorial circuit means supplied by address signals and supplying the non-volatile registers with an inhibition signal for inhibiting the selection of redundancy memory elements when a memory element of the matrix is addressed whose address coincides with the address stored in a non-programmed memory register.

By taking advantage of the known logical state stored in the unprogrammed memory elements, it is possible, by means of a redundancy circuitry according to the invention, to prevent unused redundancy word lines or bit lines from being selected when addressing a non-defective word line or bit line whose address configuration coincides with that stored in the non-programmed non-volatile memory registers by just supplying the redundancy circuitry with an inhibition signal when said address configuration is supplied to the memory device. No guard memory cells are necessary in the non-volatile memory registers, and the chip area is thus reduced.

The features of the present invention will be made more evident by the following detailed description of a particular embodiment.

BRIEF DESCRIPTION OF THE DRAWINGS

FIG. 1 is an electrical schematic diagram of a part of a redundancy circuitry according to the invention.

FIG. 2 is a schematic block diagram of a memory cell of a non-volatile memory register.

DETAILED DESCRIPTION OF THE INVENTION

Figure 3:
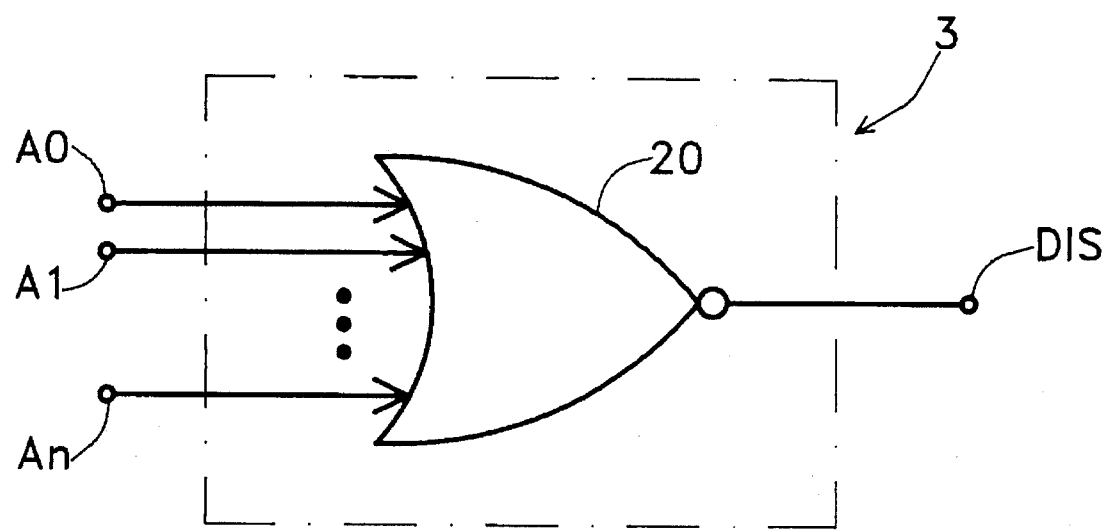
FIG. 3 is a schematic diagram of the combinatorial circuit of FIG. 1.

A redundancy circuitry according to the invention is integrated in a memory device chip and comprises a plurality of non-volatile memory registers 1, each associated with a respective redundancy word line or bit line (not shown in the drawings). The plurality of non-volatile memory registers 1 can be divided into two sets, a first set comprising all the non-volatile registers 1 which are associated with redundancy word lines, and a second set comprising all the non-volatile registers which are instead associated with redundancy bit lines. In FIG. 1, two non-volatile registers 1 are shown which belong to a same set comprising i+1 registers 1, that in the following is assumed to be the first set. As regards the second set, the following description is still valid, provided that the terms "row" and "word line" are replaced by the terms "column" and "bit line".

Each non-volatile memory register 1 is supplied with row address signals A0–An, which taken as a whole represent a row address bus ADD; the row address bus ADD also supplies row decoding circuits (not shown) for the selection of a particular word line in the memory matrix.

Each non-volatile register 1 comprises a plurality of programmable non-volatile memory cells MC0–MCn; each of said cells MC0–MCn is supplied with one of the row address signals A0–An and comprises, in a per-se known way, at least one programmable non-volatile memory element 6, a first circuit 5 for programming said memory element 6, a second circuit 7 for reading the information stored in the non-volatile memory element 6 and a third circuit 8 for comparing said information with the current logical state of the respective row address signal A0–An (FIG. 2). All the memory cells MC0–MCn of a non-volatile memory register 1 are supplied with a signal PGM supplied by a control circuitry 4 of the memory device to enable the programming of the memory element 6; different non-volatile memory registers 1 are supplied with different signals PGM, so that one register 1 is programmable at a time. Each memory cell MC0–MCn has an output signal CMP0–CMPn which is activated whenever the current logical state of the respective row address signal A0–An coincides with the logical state stored in the non-volatile memory element 6 of the cell MC0–MCn.

The control circuit 4 is a logic control circuit of any suitable type, many being well known in the art. The circuit 4 includes those circuits generally provided on a memory to control their operating modes. In the simplest case, the control circuit 4 is comprised of logic gates which, according to voltage levels present on certain external pins or input signal lines, enable various modes of the memory, such as the programming mode, the read mode, a factory specified test mode, or the like. The exact structure and specific functions of the circuit 4 will vary from chip to chip and can be quite complex. However, such control circuitry is part of memory chips today and those with skill in the art will be able to select or design such a circuit for each memory chip using known circuits and general background knowledge based on the use of circuit 4 as described herein.

Each non-volatile memory register 1 further comprises a redundancy word line selection circuit 2 which is supplied with all the signals CMP0–CMPn and generates a signal RS0–RSi used to select one redundancy word line and to deselect a defective word line whose address coincides with the address configuration stored in the non-volatile register 1.

The redundancy circuitry also comprises a combinatorial circuit 3 supplied with the row address bus ADD and generating a signal DIS which is individually supplied to all the redundancy word line selection circuits 2.

At the end of the manufacturing process of the memory device, all the programmable non-volatile memory elements 6 included in the memory cells MC0–MCn of all the non-volatile memory registers 1 are in a well known and defined logical state, i.e., in the virgin or non-programmed state. In the case of UV EPROM devices, this is assured by an exposure to UV light during the final steps of the manufacturing process; in the case of EEPROM or Flash EEPROM devices, both UV light exposure and electrical erasure can be performed to guarantee that all the non-volatile memory elements 6 of the non-volatile registers 1 are in the same starting condition.

During the memory device testing, the address configurations corresponding to defective word lines or bit lines are programmed into respective nonvolatile memory registers 1. Each time a defective word line or bit line is encountered, the testing machine puts the memory device in a condition such that the control circuitry 4 activates one signal PGM, to enable the programming of the memory cells MC0–MCn of a given non-volatile memory register 1. In this way any successive attempt to address said defective word lines or bit lines will automatically cause redundancy word lines or bit lines to be addressed. At the end of this phase, it is possible that some redundancy word lines or bit lines are left unused, and the associated non-volatile memory registers 1 are therefore left in their unprogrammed state.

The combinatorial circuit 3 is designed to recognize if all the address signals ADD currently supplied to the memory device are in a logical state coincident with the well known virgin or non-programmed state of the programmable memory elements 6 in the memory cells MC0–MCn of non-volatile registers 1. In such a scenario, the combinatorial circuit activates the signal DIS which inhibits the generation of the redundancy word line or bit line selection signals RS0–RSi. In this way even if no guard memory cells are provided in the non-volatile registers 1, no ambiguous selections of redundancy word lines or bit lines take place when the memory device is supplied with an address coincident with that stored in non-programmed registers 1. Similarly, this preferred embodiment also prevents that, when two or more redundancy word lines or bit lines are not used, the addressing of the non-defective word line or bit line having an address configuration coincident with that stored in the respective non programmed non-volatile registers 1 causes said two or more unused redundancy word line or bit line to be simultaneously selected.

Obviously, this solution prevents defective word lines or bit lines having an address configuration coincident with that stored in non-programmed non-volatile registers 1 from being repaired, since redundancy word lines or bit lines selection is inhibited whenever said address configuration is encountered. This however does not constitute a great drawback, since the probability of having defective memory elements in such word lines or bit lines is small. This means that even if memory device chips having defects in such word lines or bit lines are to be rejected, the overall process yield is nevertheless improved, because the reduction in the chip area a greater number of chips are obtained in each semiconductor wafer.

The combinatorial circuit 3 can be constructed as a part of the row or column address decoding circuits, the signal DIS being, in this case, one of the word line or bit line selection signals. It is known that said address decoding circuits are made up of a plurality of identical blocks, each decoding a particular configuration of the address signals. In practice the address configuration stored in non-programmed registers 1 is represented by an "all 0" or by an "all 1" configuration. Moreover, the blocks performing the decoding of such address configurations are typically physically located at the periphery of the address decoding circuits. As a result, it is simple, from the point of view of the physical layout of the device, to extract the signal DIS from the address decoding circuits and to supply it to the redundancy circuitry.

FIG. 3 shows one example of combinatorial circuit 3, which generates signal DIS when address bus A0–An carries the selected address corresponding to that stored in the unprogrammed non-volatile registers 1. Circuit 3 includes an n-input NOR gate 20, which generates a high logic state at its output when a low logic state is simultaneously present on all its inputs. Some or all of the inputs may include inverters, which may either be integral with NOR gate 20 or external thereto. The pattern of inverters determines the selected address, which when present on the address bus will cause NOR gate 20 to generate at its output a high logic state, i.e., activate DIS. In the example shown in FIG. 3, no inverters are used; thus, address 0 is the selected address stored in the unprogrammed registers 1. Although shown as a NOR gate, combinatorial circuit 3 may be formed from other circuits without departing from the spirit and scope of the invention. For example, various combinations of inverters, AND, OR and NAND gates may be used.

The discussion provided herein will enable those skilled in the art to make modifications to the described embodiment that do not depart from the spirit and the scope of the present invention. Accordingly, the present invention is not limited to the above-described preferred embodiment.

We claim:

1. Redundancy circuitry for a semiconductor memory device, the redundancy circuitry comprising:

a matrix of rows and columns of memory elements and redundancy rows and redundancy columns of redundancy memory elements;

a plurality of programmable non-volatile memory registers programmable to store addresses of defective memory elements which must be replaced by redundancy memory elements, said plurality of programmable non-volatile memory registers being formed by a first set of programmable non-volatile memory registers each associated with one of said redundancy rows and by a second set of programmable non-volatile memory registers each associated with one of said redundancy columns; and combinational circuit means, each set of programmable non-volatile memory registers being provided with respective combinatorial circuit means respectively supplied with row address signals and column address signals for inhibiting the selection of the redundancy rows and of the redundancy columns respectively when a matrix row or a matrix column is addressed whose address coincides with the address stored in a non-programmed memory register of the first set or of the second set.

2. Redundancy circuitry according to claim 1 wherein each programmable non-volatile memory register of said first set and second set comprises;

a number of programmable memory cells respectively equal to the number of row address signals and to the number of column address signals, each memory cell being supplied with one address signal and generating an output signal when the logical state of said address signal correspond to the logical state stored in the memory cell; and selection circuits means supplied with the output signals of the memory cells for generating a selection signal for selecting the respective redundancy row or redundancy column and inhibiting the selection of the defective row or column whose address is stored in the memory cells of the non-volatile register, said selection circuits means being also supplied with an inhibition signal supplied by the respective combinatorial circuit means to prevent said selection signal from being generated.

3. Redundancy circuitry according to claim 2 wherein each memory cell comprises;

at least one programmable non-volatile memory element;

first circuit means for programming said non-volatile memory element;

second circuit means for reading an information stored in said non-volatile memory element; and third circuit means for comparing said information with the logical state of the address signal supplied to the memory cell and generating said output signal.

4. The redundancy circuitry according to claim 1 wherein said combinatorial circuit means provided to the first set and to the second set of non-volatile memory registers are also parts of a row decoding circuit and of a column decoding circuit, respectively, supplied with row address signals and with column address signals to select the addressed row and column of the memory matrix.

5. A semiconductor memory device comprising:

a matrix of memory elements and a non-volatile memory register for storing the address of a defective memory element, the non-volatile memory register being formed by a plurality of non-volatile memory cells and being addressable via address signals of an address bus; and means for inhibiting the selection of the non-volatile memory register when each of the address signals of the address bus is in a first state, the first state being a logic value that approximates that of an initial non-programmed state of the plurality of non-volatile memory cells.

6. A semiconductor memory device comprising:

a matrix of memory elements and a non-volatile memory register for storing the address of a defective memory element, the non-volatile memory register being formed by a plurality of non-volatile memory cells and being addressable via address signals of an address bus; and means for inhibiting the selection of the non-volatile memory register when each of the address signals of the address bus is in a first state, the first state being a logic value that approximates that of a programmed state of the plurality of non-volatile memory cells.

7. A semiconductor memory device comprising:

a matrix of memory elements and a non-volatile memory register for storing the address of a defective memory element, the non-volatile memory register being formed by a plurality non-volatile memory cells and being addressable via address signals of an address bus; and means for inhibiting the selection of the non-volatile memory register when each of the address signals of the address bus is in a first state, the means for inhibiting the selection of the non-volatile memory register being a line selection signal extracted from an address decoding circuit of the semiconductor memory device, the address decoding circuit creating the line selection signal whenever each of the address signals of the address bus is in the first state.

8. A redundancy circuit in a semiconductor device having a memory matrix, the redundancy circuit comprising:

a non-volatile memory register having a plurality of programmable non-volatile memory cells and a redundancy line selection circuit, wherein each of the plurality of programmable non-volatile memory cells has a specified value and wherein each of them plurality of progammable non-volatile memory cells is supplied with a distinct address signal from an address bus, the redundancy line selection circuit generating a redundancy signal when, for each of the progammable non-volatile memory cells, the specified value is equivalent to the distinct address signal; and a combinatorial circuit that inhibits the redundancy line selection circuit from generating the redundancy signal when each of the specified values for each of the plurality of programmable non-volatile memory cells is in a first state, the combinatorial circuit outputting an inhibiting signal, the inhibiting signal being extracted from an address decoding circuit of the semiconductor device, the address decoding circuit producing the inhibiting signal whenever each of the address signals of the address bus is in the first state.

9. The redundancy circuit of claim 8 wherein the combinatorial circuit inhibits the redundancy line selection circuit from generating the redundancy signal when each of the plurality of programmable non-volatile memory cells is in a virgin state.

10. The redundancy circuit of claim 8 wherein the combinatorial circuit inhibits the redundancy line selection circuit from generating the redundancy signal when each of the plurality of programmable non-volatile memory cells is in a programmed state.

11. A redundancy circuit in a semiconductor device having a memory matrix, the redundancy circuit comprising:

a non-volatile memory register having a plurality of programmable non-volatile memory cells and a redundancy line selection circuit, wherein each of the plurality of programmable non-volatile memory cells has a specified value and wherein each of the plurality of programmable non-volatile memory cells is supplied with a distinct address signal from an address bus, the redundancy line selection circuit generating a redundancy signal when, for each of the programmable non-volatile memory cells, the specified value is equivalent to the distinct address signal; and a logic gate that inhibits the redundancy line selection circuit from generating the redundancy signal when each of the specified values for each of the plurality of programmable non-volatile memory cells is in a first state, said logic gate inputting the address signals of the address bus, said logic gate outputting an inhibiting signal, the inhibiting signal being extracted from an address decoding circuit of the semiconductor device, the address decoding circuit producing the inhibiting signal whenever each of the address signals of the address bus is in the first state.

12. The redundancy circuit of claim 11 wherein:

said logic gate comprises a NOR gate; and the first state is a logic 0.

13. The redundancy circuit of claim 11 wherein said non-volatile memory register is unprogrammed.

* * * * *

UNITED STATES PATENT AND TRADEMARK OFFICE
CERTIFICATE OF CORRECTION

PATENT NO. : 5,566,114
DATED : October 15, 1996
INVENTOR(S) : Luigi Pascucci, et. al.

It is certified that error appears in the above-indentified patent and that said Letters Patent is hereby corrected as shown below:

In column 7, claim 8, line 36, please delete "them" and insert therefor --the--.

Signed and Sealed this

Eleventh Day of February, 1997

Attest:

BRUCE LEHMAN

Attesting Officer     Commissioner of Patents and Trademarks